United States Patent
Seino et al.

(10) Patent No.: US 9,853,207 B2
(45) Date of Patent: Dec. 26, 2017

(54) MAGNETORESISTANCE EFFECT ELEMENT

(71) Applicant: CANON ANELVA CORPORATION, Kawasaki-shi (JP)

(72) Inventors: Takuya Seino, Kawasaki (JP); Kazumasa Nishimura, Kawasaki (JP); Toshikazu Irisawa, Kawasaki (JP); Saki Shibuichi, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 15/258,096

(22) Filed: Sep. 7, 2016

(65) Prior Publication Data
US 2016/0380187 A1 Dec. 29, 2016

Related U.S. Application Data

(63) Continuation of application No. PCT/JP2016/000158, filed on Jan. 14, 2016.

(30) Foreign Application Priority Data

May 22, 2015 (JP) ................................ 2015-104341

(51) Int. Cl.
*H01L 43/10* (2006.01)
*H01L 43/08* (2006.01)
(Continued)

(52) U.S. Cl.
CPC ............ *H01L 43/10* (2013.01); *G01R 33/098* (2013.01); *G11C 11/161* (2013.01); *H01F 10/3236* (2013.01); *H01F 10/3272* (2013.01); *H01L 43/08* (2013.01); *H01F 10/3286* (2013.01); *H01L 43/12* (2013.01)

(58) Field of Classification Search
CPC .................. H01L 43/08; H01L 43/10
See application file for complete search history.

(56) References Cited

U.S. PATENT DOCUMENTS 7,663,197 B2   2/2010   Nagase et al.
8,036,025 B2   10/2011  Nagase et al.
(Continued)

FOREIGN PATENT DOCUMENTS

JP   2007-142364 A   6/2007
JP   2013-187409 A   9/2013
(Continued)

OTHER PUBLICATIONS

D. C. Worledge et al., "Spin Torque Switching of Perpendicular Ta/CoFeB/MgO-based Magnetic Tunnel Junctions," 98 Appl. Phys. Lett. 02250-(1-3) (Jan. 2011).
(Continued)

*Primary Examiner* — Tran Tran
(74) *Attorney, Agent, or Firm* — Fitzpatrick, Cella, Harper & Scinto

(57) ABSTRACT

A magnetoresistance effect element of the present invention includes: a barrier layer; a reference layer formed on one surface of the barrier layer; a free layer formed on the other surface of the barrier layer; and a pinned layer placed on the opposite side of the reference layer from the barrier layer. The pinned layer includes a structure obtained by stacking Ni, Co, Pt, Co, Ru, Co, Pt, Co, and Ni layers in this order.

1 Claim, 10 Drawing Sheets

(51) Int. Cl.
  G01R 33/09 (2006.01)
  G11C 11/16 (2006.01)
  H01F 10/32 (2006.01)
  H01L 43/12 (2006.01)

(56) References Cited

U.S. PATENT DOCUMENTS

| | | | |
|---|---|---|---|
| 8,363,462 | B2 | 1/2013 | Nagase et al. |
| 8,728,830 | B2 | 5/2014 | Nishimura |
| 9,065,041 | B2 | 6/2015 | Kariyada et al. |
| 9,337,419 | B2 | 5/2016 | Kariyada et al. |
| 9,343,657 | B2 | 5/2016 | Yamane et al. |
| 2009/0321246 | A1 | 12/2009 | Tsunekawa et al. |
| 2013/0134032 | A1 | 5/2013 | Tsunekawa et al. |
| 2015/0171316 | A1* | 6/2015 | Park .................. H01L 43/10 257/421 |
| 2015/0171317 | A1* | 6/2015 | Watanabe ............ H01L 43/08 257/295 |
| 2015/0318466 | A1 | 11/2015 | Shimane et al. |
| 2016/0005958 | A1 | 1/2016 | Seino et al. |
| 2016/0240217 | A1 | 8/2016 | Yamane et al. |
| 2016/0240772 | A1 | 8/2016 | Seino et al. |
| 2016/0276583 | A1 | 9/2016 | Otani et al. |

FOREIGN PATENT DOCUMENTS

| | | |
|---|---|---|
| JP | 2014-072392 A | 4/2014 |
| WO | 2016/125200 A1 | 8/2016 |

OTHER PUBLICATIONS

Erratum: "Spin Torque Switching of Perpendicular Ta/CoFeB/MgO-based Magnetic Tunnel Junctions" [Appl. Phys. Lett. 98, 022501 (2011)] 108 Appl. Phys. Lett. 139901-1 (Mar. 2016).

* cited by examiner

MAGNETORESISTANCE EFFECT ELEMENT

CROSS-REFERENCES TO RELATED APPLICATIONS

This application is a continuation application of International Application No. PCT/JP2016/000158, filed Jan. 14, 2016, which claims the benefit of Japanese Patent Application No. 2015-104341 filed May 22, 2015. The contents of the aforementioned applications are incorporated herein by reference in their entireties.

TECHNICAL FIELD

The present invention relates to a magnetoresistance effect element, particularly a magnetoresistance effect element which is suitable for a perpendicular TMR element used in a MRAM.

BACKGROUND ART

A magnetoresistance effect element is an element which changes its electric resistance when an external magnetic field is applied to it. A well-known one of the magnetoresistance effect elements is a TMR (Tunnel Magneto Resistance) element (also referred to as a "MTJ (Magnetic Tunnel Junction) element") configured to store information and detect magnetism using a TMR effect. Recent years, there has been an increasing expectation that the MTJ element will be used for a MRAM (Magnetoresistive Random Access Memory) and the like.

Non Patent Document 1 discloses a perpendicular magnetization MTJ element. The perpendicular magnetization MTJ element includes a structure in which a free layer (magnetization free layer), a tunnel barrier layer and a reference layer (magnetization fixed layer) are stacked one on another. The direction in which to magnetize the free layer and the reference layer is parallel to the direction in which to stack the free layer and the reference layer.

An increase in an MR ratio (magnetoresistance ratio) is important for the purpose of enhancing characteristics of the MRAM device using the TMR element. A layered structure including CoFeB/MgO/CoFeB which is described in Patent Document 1 is known for its high MR ratio greater than 100%.

FIG. 10 shows an example of an MTJ element using a technique described in Non Patent Document 1. The MTJ element 1000 shown in FIG. 10 is a perpendicular magnetization MTJ element (p-MTJ element) with a bottom pin structure. The MTJ element 1000 has a bottom electrode 1002, and a Ta layer (seed layer) 1003 on a substrate 1001. On top of the Ta layer 1003, the MTJ element 1000 has a Co/Pt laminate 1004, a Co layer 1005, a Ru layer 1006, a Co layer 1007, a Pt layer 1008, a Co/Pt laminate 1009 and a Ta layer (spacer layer) 1010. Furthermore, on top of the Ta layer 1010, the MTJ element 1000 has a CoFeB layer 1011 as a reference layer, a MgO layer (barrier layer) 1012, a CoFeB layer 1013 as a free layer (magnetization free layer), a capping layer 1014, and a top electrode 1015. The Co/Pt laminate 1004 of the MTJ element 1000 is a laminate obtained by alternately stacking Co layers and Pt layers in a predetermined number of repeats (N times). In addition, the laminate 1009 of the MTJ element 1000 is a laminate obtained by alternately stacking Co layers and Pt layers in a predetermined number of repeats (M times).

FIG. 11 shows an example of a perpendicular magnetization MTJ element (p-MTJ element) using a technique described in Patent Document 1. The MTJ element 2000 shown in FIG. 11 has a laminate 2005 including Co layers and Ni layers instead of the Co/Pt laminate 1004 of the MTJ element 1000. Furthermore, the MTJ element 2000 has a Ni layer 2009 instead of the Pt layer 1008, and a laminate 2010 including Co layers and Ni layers instead of the Co/Pt laminate 1009.

CITATION LIST

Patent Document

Patent Document 1: Japanese Patent Application Laid-Open No. 2007-142364

Non Patent Document

Non Patent Document 1: D. C. Worledge et al., "Spin torque switching of perpendicular Ta/CoFeB/MgO-based magnetic tunnel junctions," Appl. Phys. Lett. 98, 2011, 02250

SUMMARY OF INVENTION

In the case of the TMR element described in Non Patent Document 1 and shown in FIG. 10, much Pt and Pd included in the element are etched in an etching process after a film formation process, and the etched byproducts are redeposited on the wall surfaces of the element. This may cause a decrease in a damping constant of the element circuit, and lower the yield.

On the other hand, the MTJ element 2000 of Patent Document 1 includes neither Pt nor Pd, and thus is unlikely to have a decrease in the yield, unlike the MTJ element 1000. However, during an annealing process, Ni is diffused into the Co layers across the Ru interface, which may in turn decrease the exchange coupling magnetic field of the MTJ element 2000.

The present invention has been made for the purpose of solving the foregoing problems. An object of the present invention is to provide a magnetoresistance effect element having a higher MR ratio and a stronger exchange coupling magnetic field.

A magnetoresistance effect element according to the present invention includes: a barrier layer; a reference layer formed on one surface of the barrier layer; a free layer formed on another surface of the barrier layer; and a pinned layer placed on an opposite side of the reference layer from the barrier layer, in which the pinned layer includes Pt, Co, Ru, Co, and Pt layers stacked in this order, and a layer including Ni.

According to the magnetoresistance effect element of the present invention, it is possible to achieve a magnetoresistance effect element having a higher MR ratio and a stronger exchange coupling magnetic field. In addition, because the yield in a later-stage process is good, and the amount of the Pt usage is small, the material cost can be reduced. Moreover, according to the magnetoresistance effect element of the present invention, a magnetoresistance effect element less likely to cause magnetization reversal of a magnetization fixed layer can be achieved by forming a pinned layer having a stronger exchange coupling magnetic field.

DESCRIPTION OF EMBODIMENTS

Figure 1:
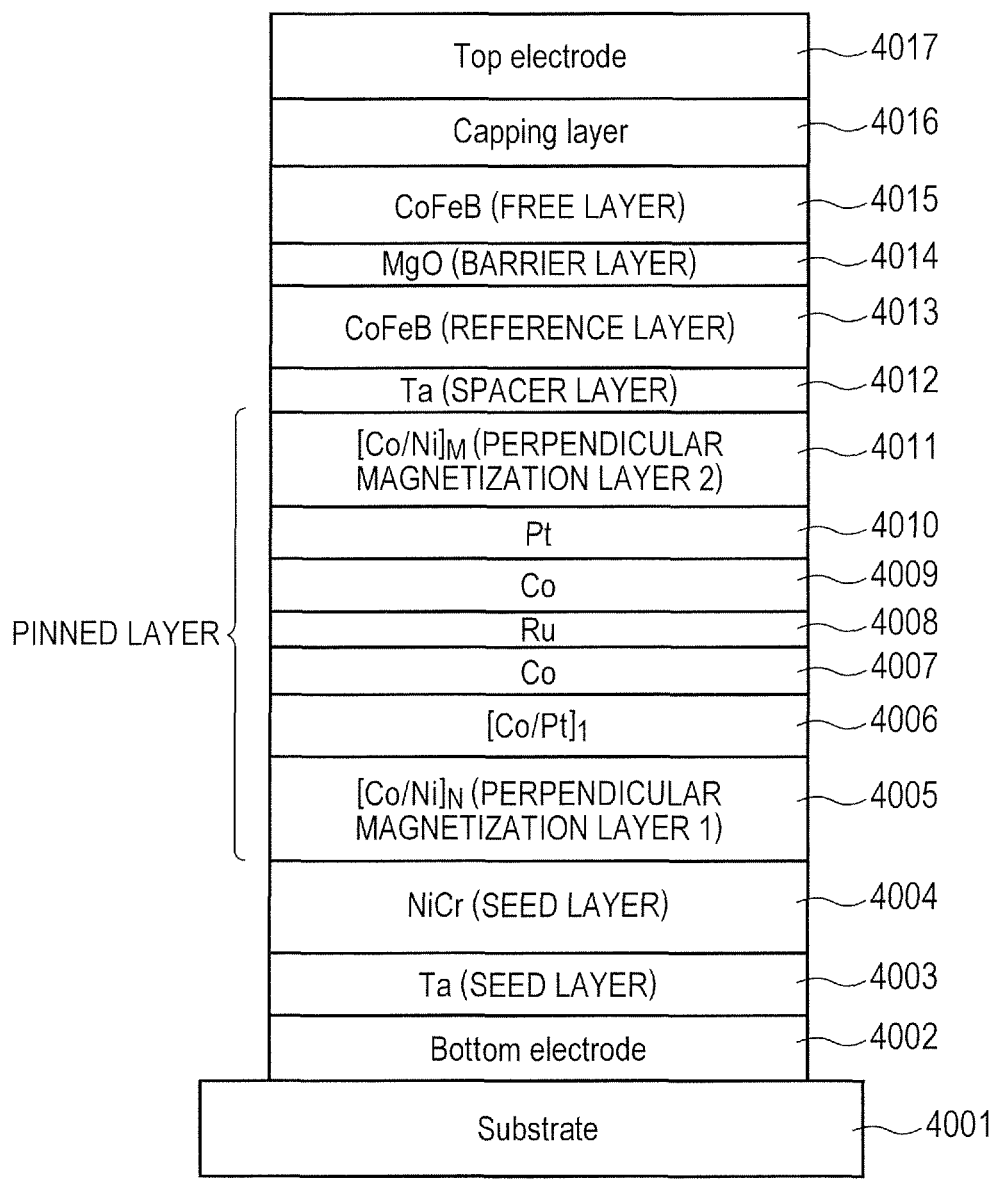
FIG. 1 is a schematic diagram showing a configuration of a MTJ element of a first embodiment of the present invention.

Referring to the drawings, descriptions will be hereinafter provided for embodiments of the present invention. The present invention, however, is not limited to the embodiments. It should be noted that: components having the same function will be denoted by the same reference numerals throughout the drawings explained below; and duplicated explanations may be omitted.

First Embodiment

FIG. 1 is a schematic diagram showing a configuration of an exemplary MTJ (Magnetic Tunnel Junction: a magnetoresistance effect element) element 4000 on which a film formation method of the embodiment is performed. The MTJ element is used, for example, for a MRAM (Magnetic Random Access Memory), a magnetic sensor, and the like.

The MTJ element 4000 is a perpendicular magnetization MTJ element (p-MTJ element) with a bottom pin structure. The MTJ element 4000 has a bottom electrode 4002, and a Ta layer (seed layer) 4003 on a substrate 4001. On top of the Ta layer 4003, the MTJ element 4000 has a NiCr (seed layer) 4004, a Co/Ni laminate 4005, a Co/Pt layer 4006, a Co layer 4007, a Ru layer 4008, a Co layer 4009, a Pt layer 4010, a Co/Ni laminate 4011, and a Ta layer (spacer layer) 4012. Furthermore, on top of the Ta layer 4012, the MTJ element 4000 has a CoFeB layer 4013 as a reference layer, a MgO layer 4014 as a barrier layer, a CoFeB layer 4015 as a free layer (magnetization free layer), a capping layer 4016, and a top electrode 4017. The Co/Ni laminate 4005 of the MTJ element 4000 is a laminate obtained by alternately stacking Co layers and Ni layers in a predetermined number of repeats (N times). In addition, the Co/Ni laminate 4011 is a laminate obtained by alternately stacking Co layers and Ni layers in a predetermined number of repeats (M times).

The CoFeB layer 4013 is formed on one surface of the MgO layer 4014, and the CoFeB layer 4015 is formed on the other surface of the MgO layer 4014. In this respect, a layered structure including the Co/Ni laminate 4005 through the Co/Ni laminate 4011 is called a pinned layer with a SAF structure (hereinafter referred to as a pinned layer). The pinned layer is an antiferromagnetic layer, and is placed on an opposite side of the CoFeB layer 4013 from the MgO layer 4014. To put it in detail, the pinned layer is placed on an opposite side of the CoFeB layer 4013 from a side on which the barrier layer 4014 is placed, and is placed below the CoFeB layer 4013. The pinned layer has an exchange coupling magnetic field which is large enough to suppress magnetization reversal of the reference layer.

The pinned layer of the MTJ element 4000 has the layered structure in which a three-layered structure portion formed of the Co layer 4007, the Ru layer 4008 and the Co layer 4009 is interposed between a PT layer of the Co/Pt layer 4006 and the Pt layer 4010. In other words, the pinned layer has the layered structure in which the layers are stacked in a Pt (4006)/Co (4007)/Ru (4008)/Co (4009)/Pt (4010) order. Since the Pt layers (4006, 4010) are respectively placed on the outer sides of the Co layers (4007, 4009) on the two ends of the Ru layer 4008, it is possible to prevent Ni from being diffused into the Co layers (4007, 4009) during an annealing process, and thereby to inhibit a decrease in the exchange coupling magnetic field. The Pt layers which sandwich the Co layers (4007, 4009) sandwiching the Ru layer 4008 are called diffusion preventing layers. It should be noted that Ni whose diffusion is prevented by the diffusion preventing layers is Ni included in the Co/Ni laminates 4005, 4011. To put it more specifically, the pinned layer of the MTJ element 4000 has the layered structure in which the layers are stacked in a Ni/Co/Pt (4006)/Co (4007)/Ru (4008)/Co (4009)/Pt (4010)/Co/Ni order.

It should be noted that the configuration of the MTJ element 4000 is not limited to the one shown here. The effect of the present invention can be obtained from any configuration in which the SAF structure is interposed between the Pt layers from above and below, as long as the configuration is obtained by making an arbitrary modification to the one described above by doing things such as increasing or decreasing the number of layers, changing the constituent materials of the respective layers, and reversing the order of stacking the layers within a scope of not obstructing the function of the perpendicular magnetization element. For example, the NiCr layer (seed layer) 4004 may be replaced with another layer not including Ni.

Figure 2:
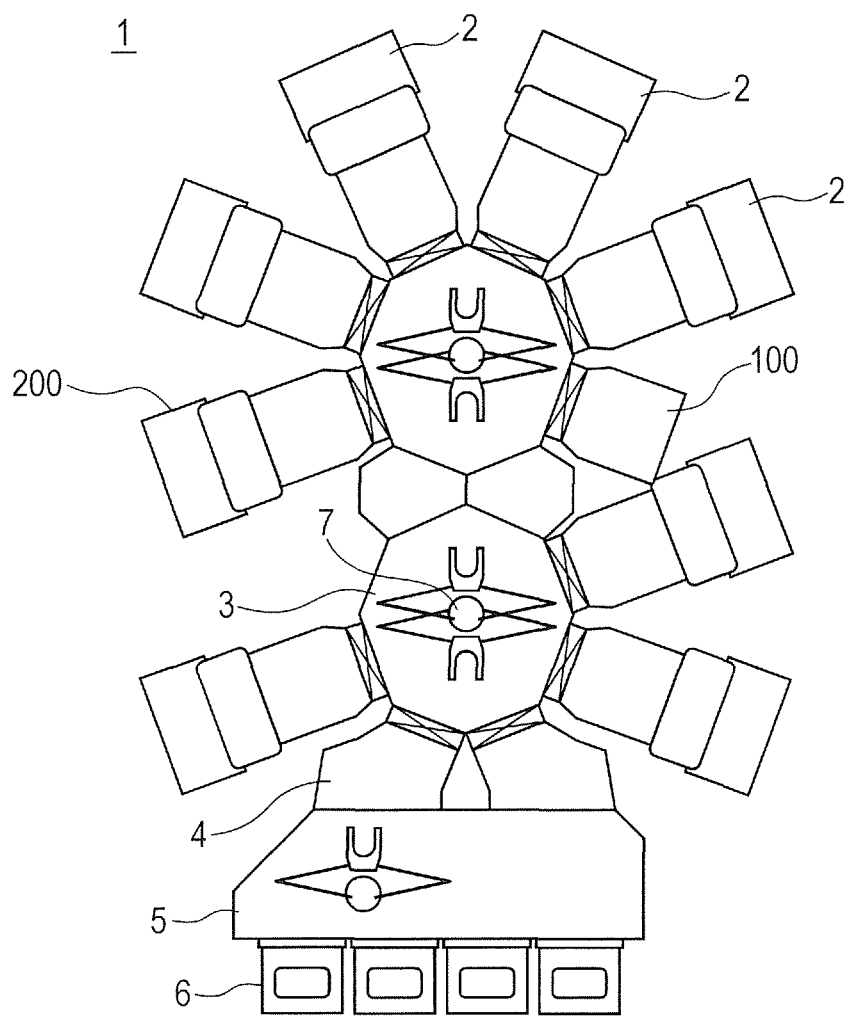
FIG. 2 is a schematic structure diagram of a substrate processing system for performing a film formation process for the MTJ element of the first embodiment of the present invention.

FIG. 2 is a schematic structure diagram of a substrate processing system 1 configured to perform a film formation process for the MTJ element 4000. The substrate processing system 1 is a cluster-type vacuum processing system, and includes multiple substrate processing chambers 2, a load-lock chamber 4, a substrate cooling apparatus 100 and a temperature raising apparatus 200. The multiple substrate processing chambers 2 may be the ones configured to perform the same process on a substrate S, or the ones configured to perform different processes on the substrate S.

The multiple substrate processing chambers 2, the load-lock chamber 4, the substrate cooling apparatus 100 and the temperature raising apparatus 200 are connected together via a transport chamber 3. Each of the connecting portions is provided with an openable and closable gate valve. The transport chamber 3 is provided with a transport robot 7. The transport robot 7 transports the substrate S among the substrate processing chambers 2, the load-lock chamber 4, the substrate cooling apparatus 100 and the temperature raising apparatus 200 in a predetermined order. An outside of the load-lock chamber 4 is provided with an autoloader 5 configured to supply the substrate S.

Figure 3:
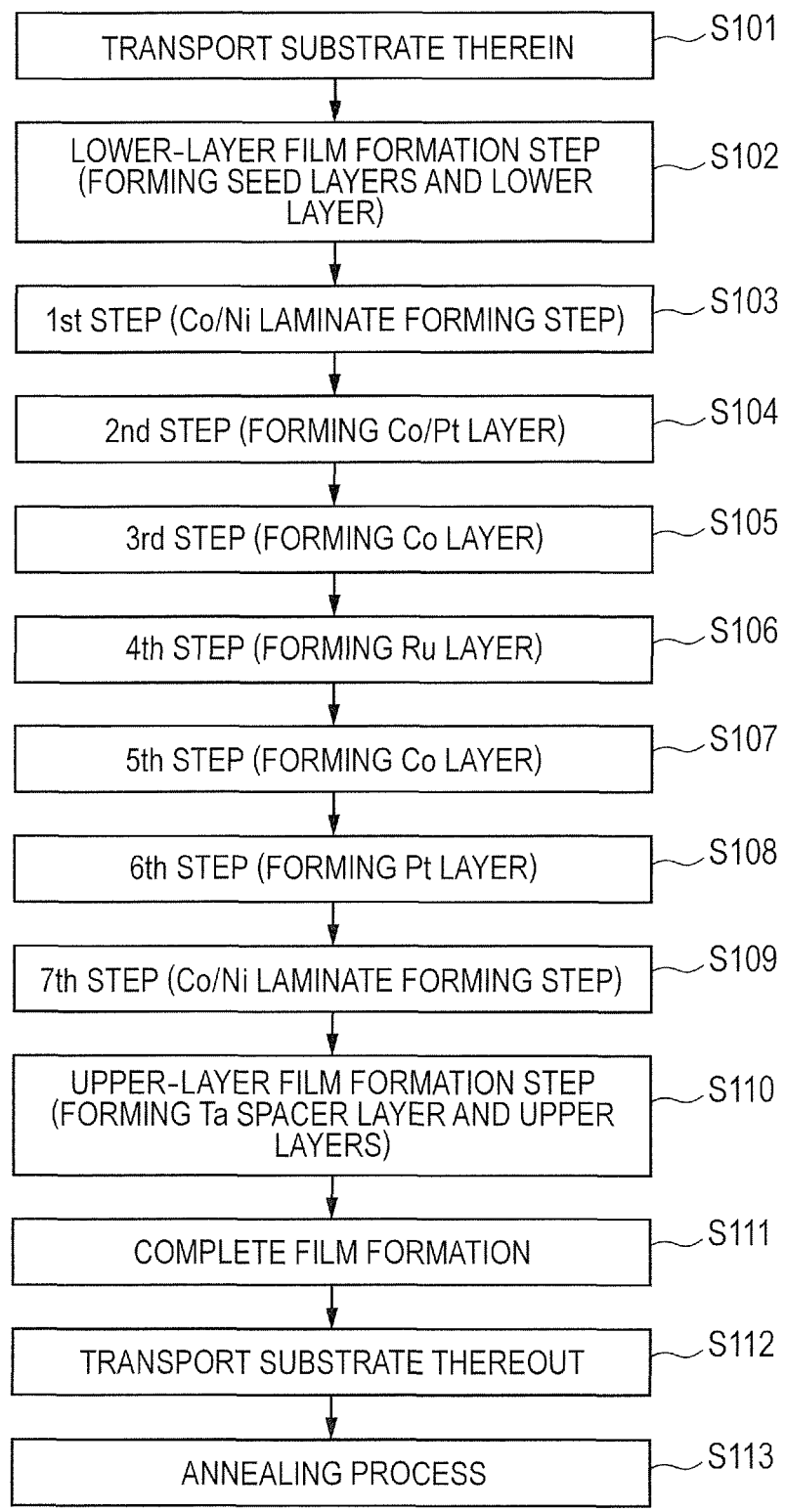
FIG. 3 is a flow chart showing a method of manufacturing the MTJ element shown in FIG. 1.

FIG. 3 is a flow chart showing a method of manufacturing the perpendicular magnetization MTJ element 4000 of the embodiment. Here, the film formation method of the embodiment will be described using the cluster-type substrate processing system 1 illustrated in FIG. 2. Incidentally, the film formation method of the embodiment may be performed using an inline substrate processing system.

To begin with, the substrate S is transported into the load-lock chamber 4 of the substrate processing system (step 101). Subsequently, the substrate S is moved to a predetermined one of the substrate processing chambers 2, where a lower-layer film formation step is performed on the substrate S (step S102). In the lower-layer film formation step, impurities and the like adhered on a surface of the substrate are removed by etching, and thereafter, the bottom electrode 4002, and the Ta layer (seed layer) 4003 and the NiCr (seed layer) 4004 are formed on the substrate in this order.

After that, the substrate S is moved to another predetermined one of the substrate processing chambers 2, where: a first step is performed on the substrate S to form the Co/Ni laminate 4005 (a perpendicular magnetization layer 1) (step S103); next, a second step is performed thereon to form the Co/Pt layer 4006 (step S104); then, a third step is performed thereon to form the Co layer 4007 (step S105); subsequently, a fourth step is performed thereon to form the Ru layer 4008 (step S106); thereafter, a fifth step is performed thereon to form the Co layer 4009 (step S107); afterward, a sixth step is performed thereon to form the Pt layer 4010 (step S108); after that, a seventh step is performed thereon to form the Co/Ni laminate 4011 (step S109).

Thereafter, the substrate S is sequentially moved to predetermined ones of the substrate processing chambers 2, where an upper-layer film formation step is performed thereon to sequentially form the Ta layer 4012 and the upper layers (step S110). In the upper-layer film formation step, the MgO layer 4014 is formed by radio-frequency (RF) sputtering using a MgO target. As another method, sputtering using a Mg target may be used to perform an oxidation treatment on a Mg layer formed on the CoFeB layer 4013 as the free layer. The film formation step and the oxidation treatment may be performed in the same substrate processing chamber 2, or in the respective different substrate processing chambers 2.

It should be noted that: two or more layers of the multiple layers to be formed in the film formation process (steps S102 to S110) may be formed in the same substrate processing chamber 2; otherwise, all the layers may be formed in the different substrate processing chambers 2. The layers to be formed in the film formation process (steps S102 to S110) of the embodiment are formed by sputtering. Alternatively, the layers may be formed by an arbitrary different method.

Finally, the substrate S is moved to a transport position (substrate transport position) inside the load-lock chamber 4 (step S112). After that, the substrate S is sent to a process downstream of the substrate processing system 1, where an annealing step (step S113) is performed on the substrate S using an apparatus different from the substrate processing system 1. In the annealing step, an annealing process is performed to crystallize the CoFeB layers (4013, 4015) in an amorphous state, and to obtain desirable magnetic properties. Incidentally, the annealing step (step S113) may be performed inside the substrate processing system 1 by changing the chamber configuration of the substrate processing system 1.

Figure 4:
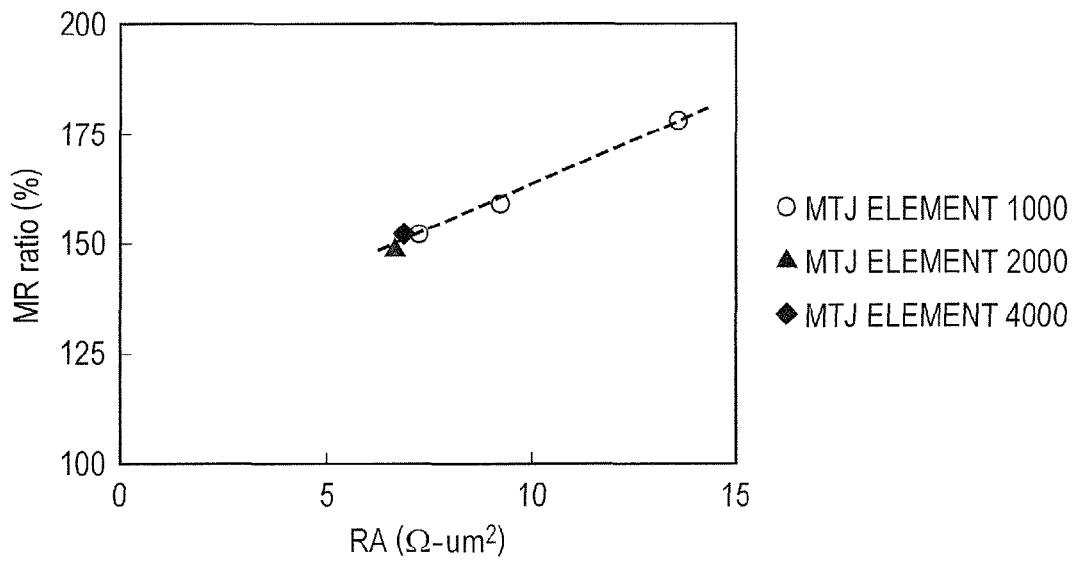
FIG. 4 is a diagram showing a MR ratio of the MTJ element shown in FIG. 1.

FIG. 4 is a diagram showing a relationship between the MR ratio and an RA (sheet resistivity) of each of MTJ elements 2000, 3000 manufactured using the film formation method of the embodiment. The RA and MR ratio were measured for each of the MTJ elements manufactured using the film formation method of the embodiment and the MTJ elements manufactured using a conventional film formation method. The conventional film formation method and the film formation method of the embodiment are the ones performed according to the flow chart shown in FIG. 3.

Figure 10:
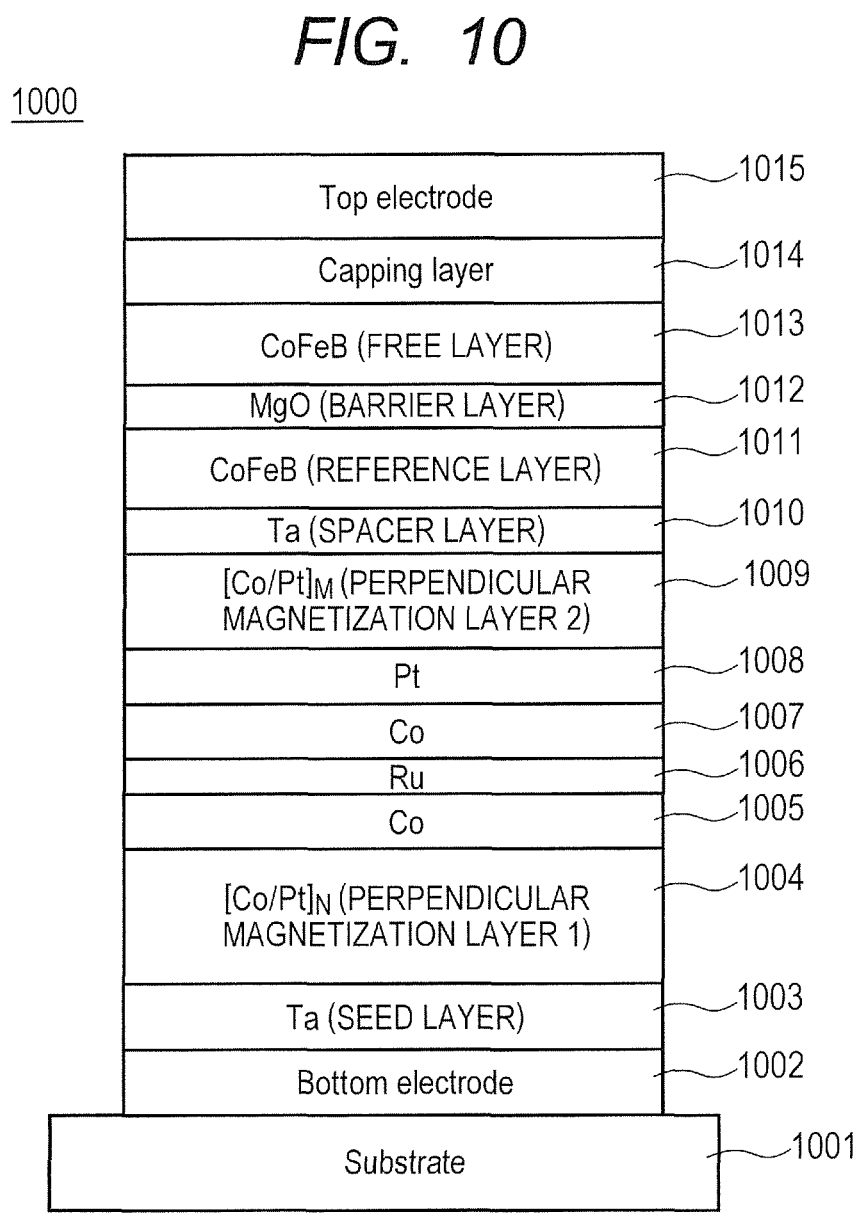
FIG. 10 is a schematic diagram showing a configuration of a conventional MTJ element.
Figure 11:
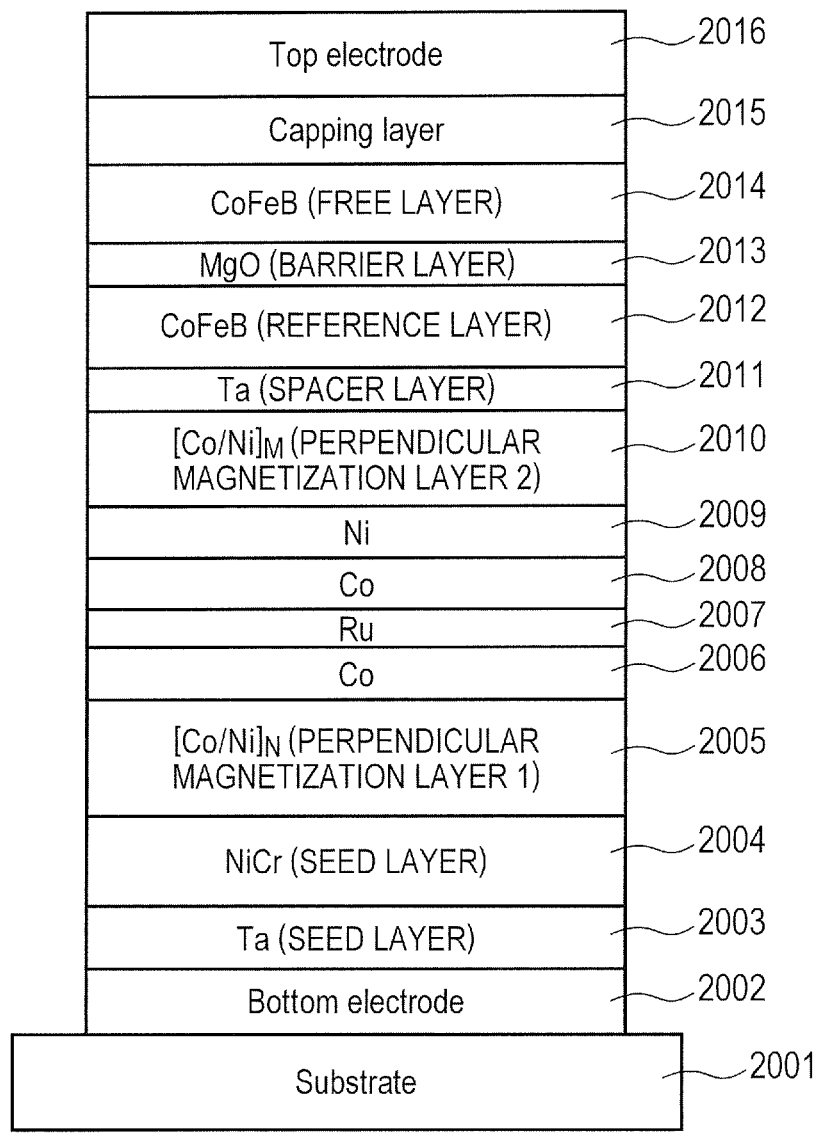
FIG. 11 is a schematic diagram showing a configuration of a conventional MTJ element.

The horizontal axis in FIG. 4 represents the RA ($\Omega \cdot \mu m^2$), while the vertical axis in FIG. 4 represents the MR ratio (%). A lower RA and a higher MR ratio mean that element characteristics of an MTJ element are better. In FIG. 4, white circles (○) represent a result of measurement of the MTJ element 1000 having an MTJ element structure shown in FIG. 10, and manufactured using the conventional film formation method. A black triangle (▲) represents a result of measurement of the MTJ element having an MTJ element structure shown in FIG. 11, and manufactured using the conventional film formation method. A black diamond (♦) represents a result of measurement of the MTJ element 4000 manufactured using the film formation method of the embodiment.

From FIG. 4, it is learned that almost equal MR ratio was obtained from the film formation using the film formation method of the embodiment regardless of whether or not the diffusion preventing layers are included in the MTJ element.

Figure 5A:
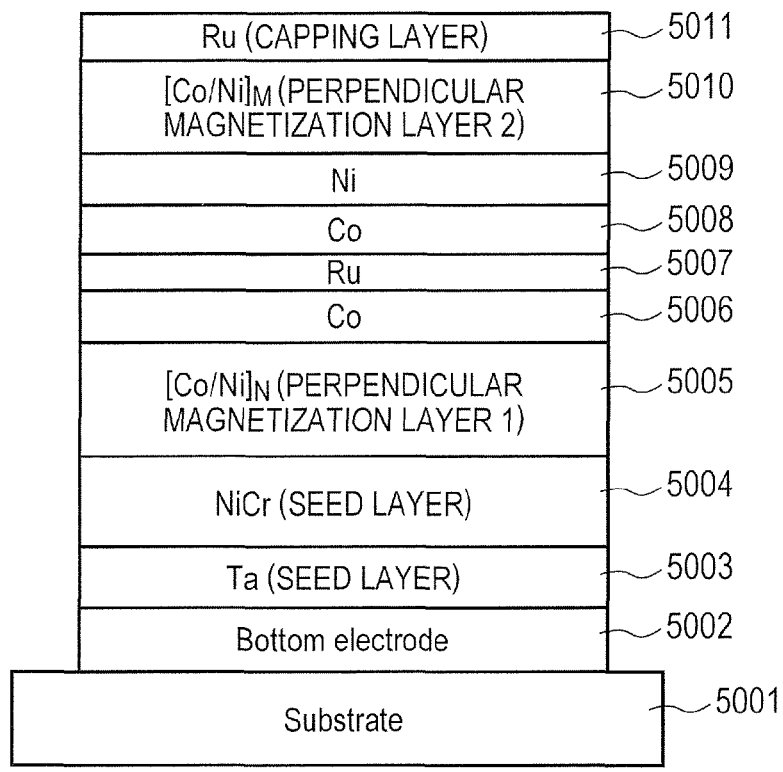
FIG. 5A is a schematic diagram showing a structure of a perpendicular magnetization film for a perpendicular MTJ element used in a magnetism measurement.
Figure 5B:
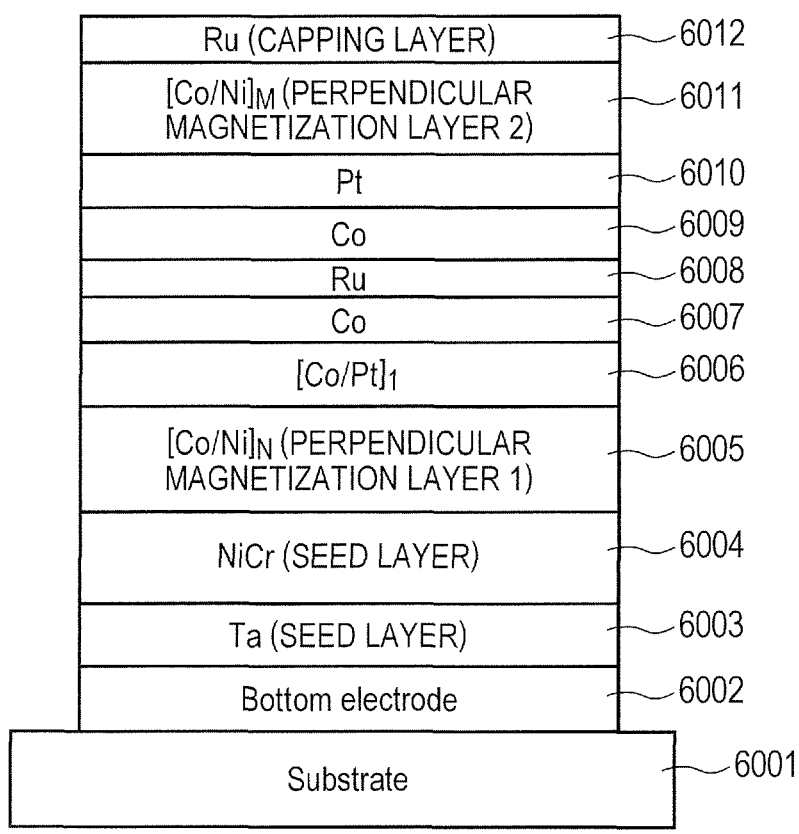
FIG. 5B is a schematic diagram showing a structure of a perpendicular magnetization film for a perpendicular MTJ element used in the magnetism measurement.

FIGS. 5A and 5B show examples of perpendicular magnetization films 5000, 6000 for perpendicular magnetization MTJ elements to be used for a measurement with a VSM (Vibrating Sample Magnetometer) (hereinafter referred to as "measurement MTJ elements 5000, 6000"). As shown in FIG. 5A, the measurement MTJ element 5000 is the one obtained by: removing a Ta layer (spacer layer) 2011, a CoFeB layer 2012 as a reference layer, a MgO layer (barrier layer) 2013, a CoFeB layer 2014 as a free layer (magnetization free layer), a capping layer 2015, and an upper electrode 2016 from the MJT element 2000 shown in FIG. 11; forming a Ru layer (capping layer) 5011 on a Co/Ni laminate 5010 (a perpendicular magnetization layer 2); and subsequently performing a heat treatment thereon. Incidentally, a structure made from a lower electrode 5002 to the Co/Ni laminate 5010 in the measurement MTJ element 5000 is identical to a structure made from a lower electrode 2002 to the Co/Ni laminate 2010 in the MTJ element 2000.

As shown in FIG. 5B, the perpendicular magnetization MTJ element 6000 corresponds to the MTJ element of the embodiment, and is the one obtained by: removing the Ta layer (spacer layer) 4012, the CoFeB layer 4013 as the reference layer, the MgO layer (barrier layer) 4014, the CoFeB layer 4015 as the free layer (magnetization free layer), the capping layer 4016, and the upper electrode 4017 from the MTJ element 4000 shown in FIG. 1; forming a Ru layer (capping layer) 6012 on the Co/Ni laminate 4011 (the perpendicular magnetization layer 2); and subsequently performing a heat treatment thereon. Incidentally, a structure made from a lower electrode 6002 to the Co/Ni laminate 6011 in the measurement MTJ element 6000 is identical to a structure made from the lower electrode 4002 to the Co/Ni laminate 4011 in the MTJ element 4000.

Figure 6:
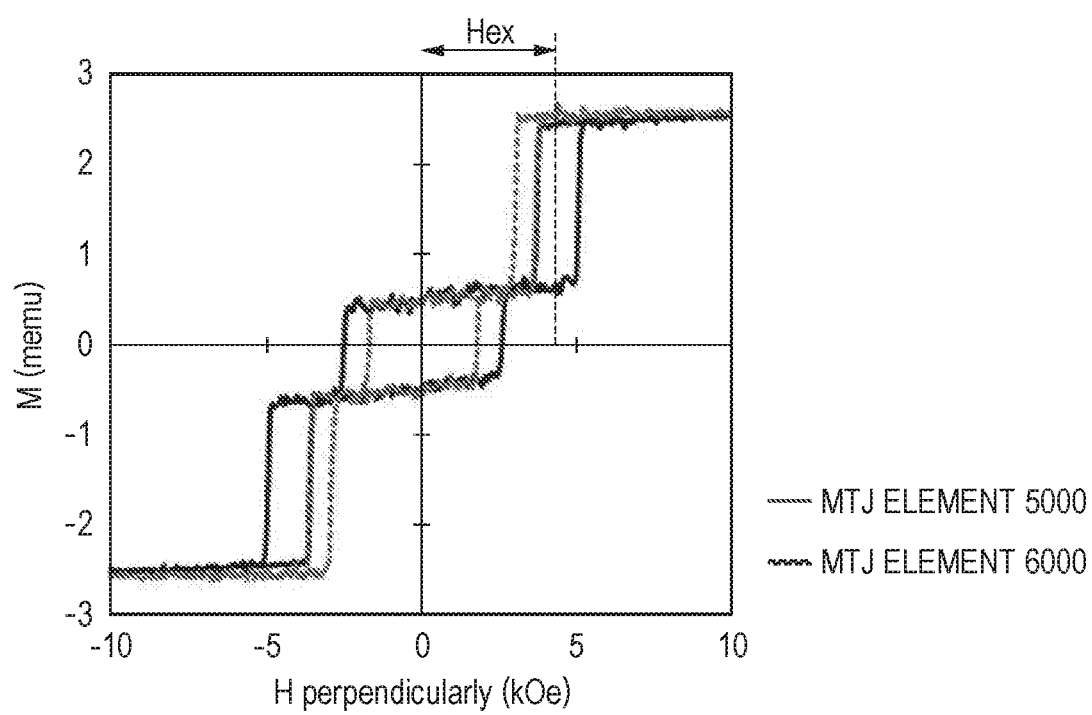
FIG. 6 shows a result of measuring the magnetism of the MTJ elements.

FIG. 6 shows a result of measuring perpendicular magnetization curves (M-H loops) of the respective measurement MTJ elements 5000, 6000. The VSM is used to measure the perpendicular magnetization curves. The horizontal axis represents the intensity of a magnetic field applied to each MTJ element, while the vertical axis represents magnetization of each layer in each MTJ element.

In FIG. 6, a dashed line represents the result of measuring the measurement MTJ element 5000 which does not include the Pt layers as the diffusion preventing layers, while a solid line represents the result of measuring the measurement MTJ element 6000 which includes the Pt layers as the diffusion preventing layers. Both MTJ elements whose measurement results are shown here are manufactured according to the flow chart in FIG. 3. As shown in FIG. 6, a larger exchange coupling magnetic field (Hex) is obtained from the result of measuring the measurement MTJ element 6000 (represented by the solid line) than from the result of measuring the measurement MTJ element 5000 (represented by the dashed line).

Figure 7:
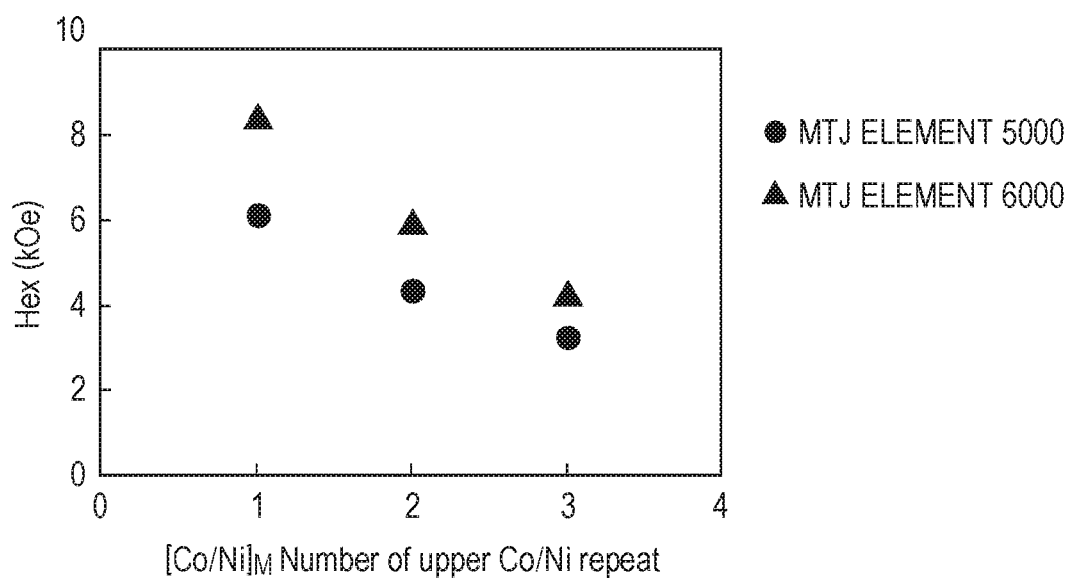
FIG. 7 shows a result of measuring the magnetism of the MTJ elements.

FIG. 7 is a diagram showing relationships between the exchange coupling magnetic field (Hex) and the number of Co/Ni repeats in the measurement MTJ elements 5000, 6000. For each of the perpendicular MTJ element structures 5000, 6000, the exchange coupling magnetic field (Hex) is calculated from the results of the measurement with the VSM, by changing the number of Co/Ni repeats, as well as by including and excluding the diffusion preventing layers. The horizontal axis in FIG. 7 represents the number of Co/Ni repeats, while the vertical axis in FIG. 7 represents the exchange coupling magnetic field (Hex). The exchange coupling magnetic field (Hex) is larger in the measurement MTJ element 6000 including the diffusion preventing layers than in the measurement MTJ element 5000 including no diffusion preventing layers in any number of Co/Ni repeats.

The magnetoresistance effect element of the embodiment has a high MR ratio equal to that of the conventional magnetoresistance effect element and a larger exchange coupling magnetic field. As a result, the magnetoresistance effect element of the embodiment is capable of preventing the occurrence of unintended magnetization reversal of the magnetization fixed layer due to an external magnetic field. In addition, the amount of Pt used in the magnetoresistance effect element thereof is less than the amount of Pt used in the conventional magnetoresistance effect element shown in FIG. 10. This inhibits a decrease in a damping constant of the element circuit after the later-stage process, and thus increases the yield. Furthermore, since the amount of Pt used in the magnetoresistance effect element thereof is less than the amount of Pt used in the conventional magnetoresistance effect element shown in FIG. 10, material costs can be reduced. Moreover, according to the method of manufacturing the perpendicular magnetization MTJ element of the present invention, the above-described magnetoresistance effect element can be manufactured.

Second Embodiment

Figure 8:
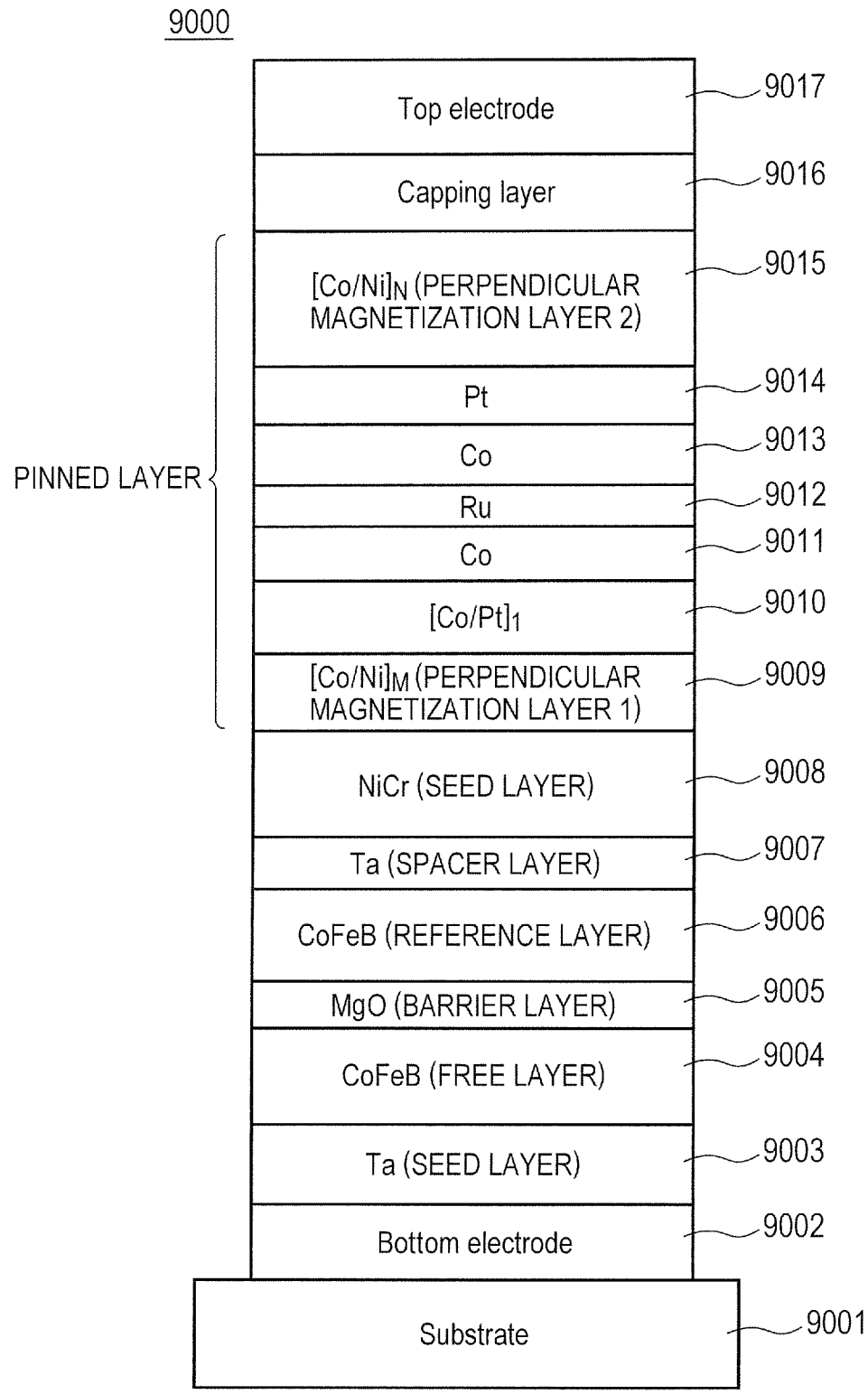
FIG. 8 is a schematic diagram showing a configuration of a MTJ element of a second embodiment of the present invention.

Although the MTJ element 4000 of the first embodiment has the structure (bottom pin structure) which has the reference layer 4013 under the tunnel barrier layer 4014, the present invention is also applicable to a structure (top pin structure) which has a reference layer on a tunnel barrier layer. FIG. 8 shows a MTJ element 9000 as an example of perpendicular magnetization MTJ element (p-MTJ element) with the top pin structure.

The MTJ element 9000 in FIG. 8 has a bottom electrode 9002, a Ta layer (seed layer) 9003, a CoFeB layer 9004 as a free layer (magnetization free layer), a MgO layer (barrier layer) 9005, a CoFeB layer 9006 as a reference layer, a Ta layer (spacer layer) 9007, a NiCr (seed layer) 9008, a Co/Ni laminate 9009, a Co/Pt layer 9010, a Co layer 9011, a Ru layer 9012, a Co layer 9013, a Pt layer 9014, a Co/Ni laminate 9015, a capping layer 9016, and a top electrode 9017 which are stacked on a substrate 9001 in this order. The Co/Ni laminate 9009 is a laminate obtained by alternately stacking Co layers and Ni layers in a predetermined number of repeats (M times). In addition, the Co/Ni laminate 9015 is a laminate obtained by alternately stacking Co layers and Ni layers in a predetermined number of repeats (N times).

A layered structure including the Co/Ni laminate 9009 through the Co/Ni laminate 9015 is called a pinned layer with a SAF structure (hereinafter referred to as a "pinned layer"). The pinned layer is an antiferromagnetic layer, and is placed on an opposite side of the CoFeB layer 9006 from the MgO layer 9005. To put it in detail, the pinned layer is placed on an opposite side of the CoFeB layer 9006 from a side on which the barrier layer 9005 is placed, and is placed above the CoFeB layer 9006. The Pt layers (9010, 9014) are respectively placed on the outer sides of the Co layers (9011, 9013) between which the Ru layer 9012 is interposed. This placement brings about an effect of: preventing Ni from being diffused into the Co layers (9011, 9013) interfacing Ru; and thereby inhibiting a decrease in the exchange coupling magnetic field. The Pt layers which sandwich the Co layers (9011, 9013) sandwiching the Ru layer 9012 are called diffusion preventing layers. It should be noted that the configuration of the MTJ element 9000 is not limited to the one shown here. The effect of the present invention can be obtained from any configuration in which the SAF structure is interposed between the Pt layers from above and below, as long as the configuration is obtained by making an arbitrary modification to the one described above by doing things such as increasing or decreasing the number of layers, changing the constituent materials of the respective layers, and reversing the order of stacking the layers within a scope of not obstructing the function of the perpendicular magnetization element.

Figure 9:
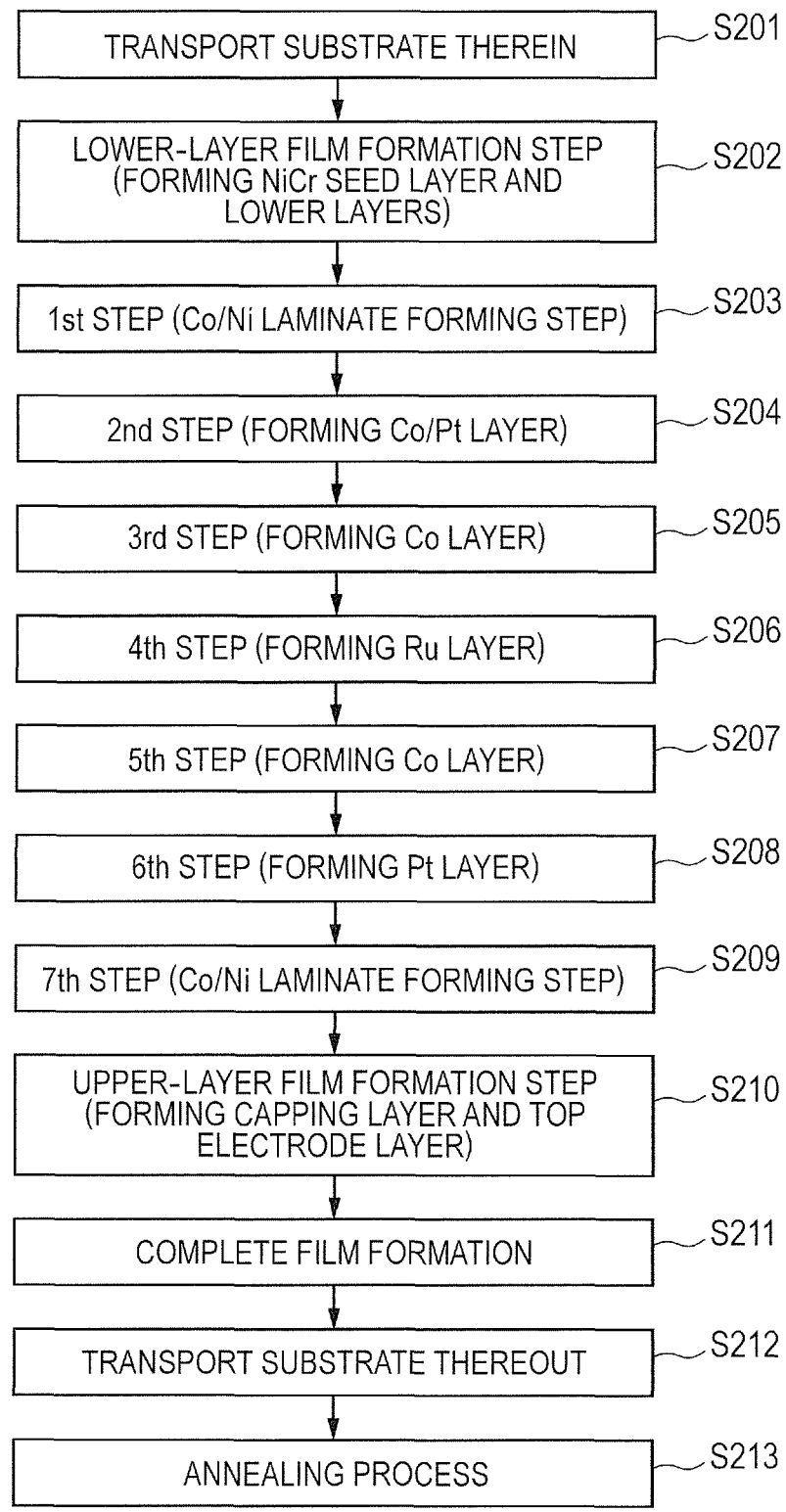
FIG. 9 is a flow chart showing a method of manufacturing the MTJ element shown in FIG. 8.

FIG. 9 is a flow chart showing a method of manufacturing the MTJ element 9000 of the embodiment. In this respect, descriptions will be provided for a film formation method of the embodiment using the cluster-type substrate processing system 1 illustrated in FIG. 2. Incidentally, the film formation method of the embodiment may be performed using an inline substrate processing system.

To begin with, the substrate S is transported into the load-lock chamber 4 of the substrate processing system (step 201). Subsequently, a lower-layer film formation step is performed on the substrate S to sequentially form layers, all to be placed under the Co/Ni laminate 9009, on the substrate S (step S202). In the lower-layer film formation step, impurities and the like clinging to the surfaces of the substrate are removed by etching, and thereafter, the bottom electrode 9002, and the Ta layer (seed layer) 9003, the CoFeB layer (free layer) 9004, the MgO layer (barrier layer) 9005, the CoFeB layer (reference layer) 9006, the Ta layer (spacer layer) 9007 and the NiCr (seed layer) 9008 are formed on the substrate in this order. In the lower-layer film formation step, the MgO layer 9005 is formed by radio-frequency (RF) sputtering using a MgO target. As another method, sputtering using a Mg target may be used to perform an oxidation treatment on a Mg layer formed on the CoFeB layer 9004 as the free layer.

After that, a first step is performed on the substrate S to form the Co/Ni laminate 9009 (a perpendicular magnetization layer 1) (step S203). Next, a second step is performed thereon to form the Co/Pt layer 9010 (step S204). Then, a third step is performed thereon to form the Co layer 9011 (step S205). Subsequently, a fourth step is performed thereon to form the Ru layer 9012 (step S206). Thereafter, a fifth step is performed thereon to form the Co layer 9013 (step S207). Afterward, a sixth step is performed thereon to form the Pt layer 9014 (step S208). After that, a seventh step is performed thereon to form the Co/Ni laminate 9015 (step S209). Thereafter, the substrate S is sequentially moved to predetermined ones of the substrate processing chambers 2, where an upper-layer film formation step (step S210) is performed thereon to sequentially form the upper layers to be placed on the Co/Ni laminate 9015. In the upper-layer film formation step (step S210), the capping layer 9016 and the upper electrode 9017 are formed.

It should be noted that: two or more layers of the multiple layers to be formed in the film formation process (steps S202 to S210) may be formed in the same substrate processing chamber 2; otherwise, all the layers may be formed in the different substrate processing chambers 2. The layers to be formed in the film formation process (steps S202 to S210) of the embodiment are formed by sputtering. Alternatively, the layers may be formed by an arbitrary different method.

Finally, the substrate S is moved to the transport position (substrate transport position) inside the load-lock chamber 4 (step S212). After that, the substrate S is sent to a process downstream of the substrate processing system 1, where an annealing step (step S213) is performed on the substrate S using an apparatus different from the substrate processing system 1. In the annealing step, an annealing process is performed to crystalize the CoFeB layers (9004, 9006) in an amorphous state. Incidentally, the annealing step (step S213) may be performed inside the substrate processing system 1 by changing the chamber configuration of the substrate processing system 1.

The principle of the MTJ element 9000 with the top pin structure of the second embodiment is the principle of the MTJ element with the top pin structure of the first embodiment. For this reason, the RA (sheet resistivity) and the MR ratio are not affected by whether or not the diffusion preventing layers are included in the MTJ element.

Like the foregoing MTJ element 4000, the MTJ element 9000 of the embodiment has a high RM ratio and a large exchange coupling magnetic field. Thus, the MTJ element 9000 is capable of preventing the occurrence of unintended magnetization reversal of the reference layer due to an external magnetic field. In addition, the good yield in the later-stage process and the small amount of the Pt usage enable reduction in the material cost. Moreover, according to the method of manufacturing the perpendicular magnetization MTJ element of the present invention, the above-described magnetoresistance effect element can be manufactured.

The invention claimed is:

1. A magnetoresistance effect element comprising:
   a barrier layer;
   a reference layer formed on one surface of the barrier layer;
   a free layer formed on another surface of the barrier layer; and
   a pin layer placed on an opposite side of the reference layer from the barrier layer, wherein
   the pin layer includes a structure obtained by stacking Ni, Co, Pt, Co, Ru, Co, Pt, Co, and Ni layers in this order.

* * * * *